(12) United States Patent
Tomita et al.

(10) Patent No.: US 7,790,270 B2
(45) Date of Patent: Sep. 7, 2010

(54) WIRING BOARD AND SEMICONDUCTOR DEVICE

(75) Inventors: Yoshihiro Tomita, Kadoma (JP);
Masanori Minamio, Kadoma (JP);
Toshiyuki Fukuda, Kadoma (JP)

(73) Assignee: Panasoniic Corporation, Osaka (JP)

( * ) Notice: Subject to any disclaimer, the term of this patent is extended or adjusted under 35 U.S.C. 154(b) by 435 days.

(21) Appl. No.: 11/898,971

(22) Filed: Sep. 18, 2007

(65) Prior Publication Data
US 2008/0081161 A1    Apr. 3, 2008

(30) Foreign Application Priority Data
Sep. 28, 2006    (JP) .............................. 2006-263662

(51) Int. Cl.
*B32B 3/00* (2006.01)
(52) U.S. Cl. ...................... 428/210; 428/209; 174/255; 174/260; 174/262
(58) Field of Classification Search ................ 428/209, 428/210; 174/255, 260, 262–266; 361/792–795
See application file for complete search history.

(56) References Cited

U.S. PATENT DOCUMENTS

| 6,865,089 | B2* | 3/2005 | Ho et al. | 361/761 |
| 7,045,391 | B2* | 5/2006 | Lin | 438/109 |
| 7,078,788 | B2* | 7/2006 | Vu et al. | 257/668 |
| 7,235,477 | B2* | 6/2007 | Ogawa | 438/622 |
| 7,242,092 | B2* | 7/2007 | Hsu | 257/723 |
| 7,262,497 | B2* | 8/2007 | Fang | 257/701 |
| 7,298,047 | B2* | 11/2007 | Kawakami et al. | 257/758 |
| 7,338,884 | B2* | 3/2008 | Shimoto et al. | 438/459 |
| 7,338,892 | B2* | 3/2008 | Wang et al. | 438/618 |
| 7,339,118 | B1* | 3/2008 | Takada et al. | 174/255 |
| 7,449,363 | B2* | 11/2008 | Hsu | 438/106 |

FOREIGN PATENT DOCUMENTS

| JP | 2000-216304 | 8/2000 |
| JP | 2001-53448 | 2/2001 |

* cited by examiner

*Primary Examiner*—Chris Chu
(74) *Attorney, Agent, or Firm*—Steptoe & Johnson LLP

(57) ABSTRACT

The present invention provides a wiring board which may be warped only by a reduced amount when the wiring board is thin and has wiring patterns of different shapes on the opposite surfaces thereof and which enables a thin, small, and reliable semiconductor device to be implemented. The wiring board includes a planar resin base material 12, a first resin film 26 provided on the first surface of the resin base material 12 and shaped to expose the element connection terminals 14, and a second resin film 28 provided on the second surface of the resin base material and shaped to expose the external connection terminals 16, wherein the first resin film 26 and the second resin film 28 are different in at least one of a glass transition point, cure shrinkage, and a thermal expansion coefficient.

12 Claims, 10 Drawing Sheets

WIRING BOARD AND SEMICONDUCTOR DEVICE

The present application claims priority to Japanese Patent Application No. 2006-263662, filed Sep. 28, 2006, which application is incorporated herein by reference in its entirety.

FIELD OF THE INVENTION

The present invention relates to a wiring board and a semiconductor device.

BACKGROUND OF THE INVENTION

Semiconductor devices have been required to have a reduced size and a reduced thickness and to be more inexpensive. To meet these requirements, a BGA (Ball Grid Array) configuration and a CSP (Chip Size Package) configuration use a resin wiring board as a board on which a semiconductor element is mounted.

Such a resin wiring board normally has wiring patterns on the opposite surfaces thereof. The wiring board has, on one of the opposite surfaces, a semiconductor element mounting area in which a semiconductor element is mounted and element connection terminals connected to the wiring patterns. The element connection terminals are arranged in an area inside the semiconductor element mounting area or in an area around the outer periphery of the semiconductor element mounting area. External connection terminals are provided on the other surface of the wiring board.

A solder resist layer is formed on one of the surfaces of the wiring board. The element connection terminals are exposed from the solder resist layer. A solder resist layer is also formed on the other surface of the wiring board. The external connection terminals are exposed from this solder resist layer. The element connection terminals and the external connection terminals are connected together via inner layer conductors, through conductors, or the like formed inside the wiring board.

To meet the requirements for the reduction of the size and thickness of semiconductor devices, very thin resin wiring boards of thickness at most 0.2 mm have been prevailing.

Such a thin resin wiring board is likely to be significantly warped when a semiconductor element is mounted on the wiring board. The warpage of the wiring board may result in inappropriate connections. For example, inappropriate connections are likely to occur when semiconductor element is stacked on another semiconductor element already mounted on the wiring board or when a semiconductor device having a wiring board on which a semiconductor element is mounted is mounted on a mother board or the like.

Thus, Japanese Patent Laid-Open No. 2000-216304 proposes an invention for improving the flatness of a semiconductor device of a BGA configuration using a thin board.

In the invention, a wiring board has a required wiring pattern and a housing hole in which a semiconductor element is housed. The housing hole penetrates the wiring board in the thickness direction thereof. A heat sink is fixed, via a bonding layer, to a back surface of the wiring board which is opposite a mounting surface. The heat sink covers the opening of the housing hole for the semiconductor element.

A solder resist layer is formed on the wiring board so as to cover the mounting surface. A terminal portion of a wiring pattern which forms external connection terminals is exposed from the solder resist layer. The solder resist layer is formed of a photosensitive resist and has a greater thermal expansion coefficient than the wiring board. A resin layer is formed over the solder resist layer, which is made of a resin having a smaller thermal expansion coefficient than the solder resist layer.

The thermal shrinkage of the solder resist layer can be inhibited by setting the thermal expansion coefficient of the solder resist layer greater than that of the wiring board, while setting the thermal expansion coefficient of the resin layer smaller than that of the solder resist layer, as described above. This makes it possible to avoid the possible warpage of the wiring board, allowing a very flat semiconductor device to be implemented.

That is, the above invention forms a first resin layer made of the solder resist layer on only one surface of the wiring board and forms a second resin layer having a smaller thermal expansion coefficient than the solder resist layer on the first resin layer. This improves the flatness of the wiring board.

However, it is expected that the rigidity of the heat sink fixedly bonded to the mounting surface, the other surface of the wiring board, is actually effective in contributing to improving the flatness.

The solder resist layer may be cracked or separated under heat. For example, if a semiconductor device or the like, which is likely to generate heat, is mounted on a printed wiring board with a solder resist layer formed as a surface layer, heat generated by the semiconductor device or during solder bump formation may exert a high stress on the solder resist layer. In some cases, the solder resist layer may be cracked or separated.

To prevent such cracking or separation, Japanese Patent Laid-Open No. 2001-53448 discloses an invention using a solder resist layer containing an inorganic filler.

The invention forms the solder resist layer containing the inorganic filler on the printed wiring board to reduce the thermal expansion coefficient of the solder resist layer. This reduces the difference of the thermal expansion coefficient between the solder resist layer and an interlayer resin insulating layer or the like which is present around the periphery of the solder resist layer.

As a result, after a process of manufacturing a printed wiring board or a process of mounting an electronic part such as a semiconductor element on the printed wiring board, the solder resist layer can be prevented from being cracked or separated. The publication also shows that a solder resist layer of the same material as that described above is formed on both the mounting surface and back surface of the printed wiring board.

That is, in the above invention, the solder resist layer, formed on the surface layer of the printed wiring board, contains the inorganic filler and thus has the small thermal expansion coefficient. This prevents the solder resist layer from being cracked during a heating step such as soldering.

If an insulating resin layer is formed using a photosensitive resin such as a solder resist, and a via hole is formed in the insulating layer made of the insulating resin layer, then the printed wiring board may be significantly warped when the insulating resin layer is dried after the formation of the via hole.

Japanese Patent Laid-Open No. 11-26190 discloses a method for inhibiting the possible warpage of a printed circuit board. The method completely dries and cures solder resist layers formed on the opposite surfaces of the printed wiring board, that is, insulating resin layers, before the formation of a via hole. Thus, during the drying, the resist layers on the opposite surfaces of the printed wiring board have the same area. This equalizes shrinkage behavior on the opposite surfaces of the board, reducing possible warpage.

However, the method requires the use of a laser for a process of forming a via hole in the solder resist layer. This not only increases facility costs but also makes it difficult to form an opening pattern of any shape. In particular, when a die pattern is formed under a semiconductor element, an opening pattern with a relatively large area needs to be formed. It is difficult to process such an opening pattern using a laser.

The present invention solves these problems. An object of the present invention is to provide a wiring board that is minimally warped even if the wiring board made of resin is thin and has wiring patterns of different shapes formed on the opposite surface thereof, as well as a thin, small, and reliable semiconductor device implemented using the wiring board.

DISCLOSURE OF THE INVENTION

To solve the above object, a wiring board according to the present invention includes a planar resin base material, element connection terminals arranged in a semiconductor element mounting area formed on a first surface of the resin base material and in an area around a periphery of the semiconductor element mounting area, external connection terminals arranged on a second surface of the resin base material and electrically connected to the element connection terminals, a first resin film shaped to cover the first surface of the resin base material, while exposing the element connection terminals and the semiconductor element mounting area, and a second resin film shaped to cover the second surface of the resin base material, while exposing the external connection terminals, wherein the first resin film and the second resin film are different in at least one of a glass transition point, cure shrinkage, and a thermal expansion coefficient.

In the above configuration, the first resin film formed on the first surface of the resin base material is formed to expose the semiconductor element mounting area. Consequently, the area of the second resin film formed on the second surface of the resin base material is larger than that of the first resin film. The external connection terminals are arranged in an array on the second surface of the resin base material.

However, the amount of possible warpage can be reduced even after curing by varying at least one of the glass transition point, cure shrinkage, and thermal expansion coefficient between the first resin film and the second resin film. For example, the glass transition point, cure shrinkage, or thermal expansion coefficient of the first resin film may be set greater than that of the second resin film.

This enables a resin wiring board with possible warpage minimized to be implemented even if a thin resin base material is used. Further, even if the semiconductor element is mounted on the resin wiring board, the amount of possible warpage can be reduced.

The amount of possible warpage of the resin wiring board can also be reduced when a filler contained in the first resin film and a filler contained in the second resin film are made of inorganic particles and when the amount of the filler contained in the first resin film is smaller than that of the filler contained in the second resin film. In this case, the fillers in the first and second resin films may be made of inorganic particles of different materials. Moreover, resin components in the first and second resin films may be one of an epoxy resin and a polyimide resin.

This configuration allows the glass transition point, cure shrinkage, and thermal expansion coefficient to be relatively optionally controlled. For example, silica particles with a small thermal expansion coefficient are used as the filler in the second resin film, and alumina particles having a greater thermal expansion coefficient than the silica particles are used as the filler in the first resin film. This makes it possible to make the thermal expansion coefficient of the second resin film smaller than that of the first resin film even with the same addition amount.

Alternatively, fillers with different particle sizes or shapes may be used to control the thermal expansion coefficient, glass transition point, or cure shrinkage. Alternatively, instead of controlling the filler amounts or materials, for example, a polyimide resin may be used as the resin component of the first resin film and an epoxy resin may be used as the resin component of the second resin film, to control the glass transition point, cure shrinkage, and thermal expansion coefficient.

In the above configuration, the resin base material is made of one type of resin selected from a glass epoxy resin, an epoxy resin, a bismaleimide-triazine resin (BT resin), an acrylic butadiene styrene resin (ABS resin), a polyimide resin, a polyamide resin, and an acrylic resin.

A semiconductor device according to the present invention has a semiconductor element mounted in the semiconductor element mounting area of the wiring board having any of the above configurations. This enables the possible warpage of the semiconductor device to be inhibited. Consequently, a semiconductor device can be implemented which can be easily mounted on and reliably connected to a mother board or the like, in spite of a very thin configuration. In particular, the amount of possible warpage can be reduced even in the case of a BGA configuration having solder balls with which the external connection terminals of the resin wiring board are arranged in an array. This makes it possible to implement a reliable mounting step.

A semiconductor device according to the present invention includes a first resin wiring board and a second resin wiring board each of which is made of a resin wiring board according to any of the above configurations, the first resin wiring board having stacking connection terminals provided in an area around an outer periphery of the semiconductor element mounting area on a first surface of the wiring board and connected to the second resin wiring board, the stacking connection terminals being exposed from the first resin film, the second resin wiring board having the external connection terminals provided at positions corresponding to the stacking connection terminals on the first resin wiring board, the first and second resin wiring boards having a semiconductor element mounted in the respective semiconductor element mounting areas, the stacking connection terminals on the first resin wiring board being connected to the external connection terminals on the second resin wiring board via stacking projection electrodes.

This configuration makes it possible to mount the semiconductor element on the resin wiring board to construct the semiconductor device and to easily produce a semiconductor device with a reliable stacked structure by stacking such semiconductor devices with possible warpage inhibited on one another. Moreover, even a semiconductor device having a large circuit scale can be formed to be very thin. A semiconductor device can also be implemented which can be easily mounted on and reliably connected to a mother board or the like.

The resin wiring board according to the present invention exerts the following significant effects. The resin wiring board according to the present invention is only minimally warped even when a wiring pattern is formed using a thin resin base material and is unlikely to be warped or twisted even after the semiconductor element has been mounted. This makes it possible to implement a thin semiconductor device with the BGA configuration which can be reliably mounted on a mother board or the like. This further makes it possible to provide a thin semiconductor device even when the semiconductor device is constructed by stacking such wiring boards with a semiconductor element mounted thereon. Furthermore, the terminals can be reliably connected together during the stacking. This results in a high manufacturing yield and high reliability.

DESCRIPTION OF THE EMBODIMENTS

Figure 1A:
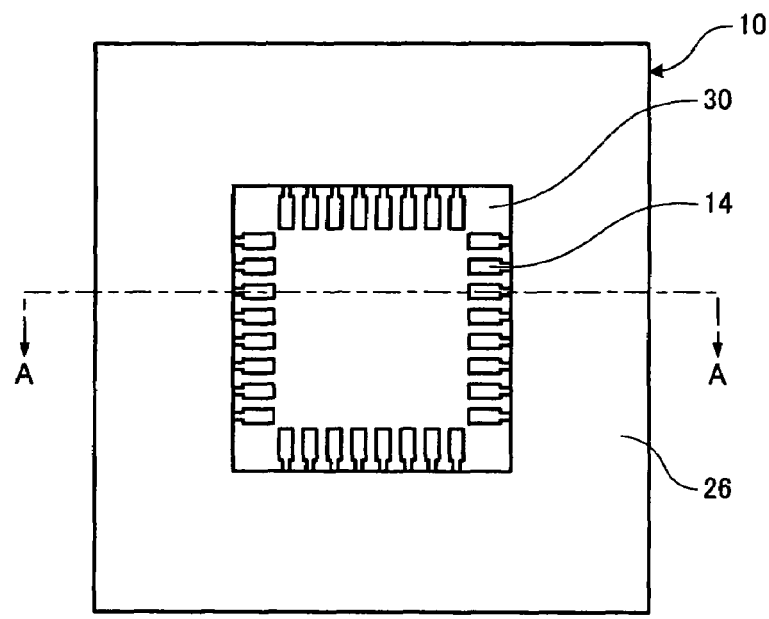
FIG. 1A is a plan view showing the configuration of a wiring board according to a first embodiment of the present invention as viewed from a semiconductor mounting area side.

Embodiments of a semiconductor device according to the present invention will be described below with reference to the drawings. The present invention is not limited to the thicknesses, lengths, or the like of members shown in the drawings, described below. In the figures, the number of electrodes for a semiconductor element and the number of terminals on a wiring board are simplified.

First Embodiment

Figure 1B:
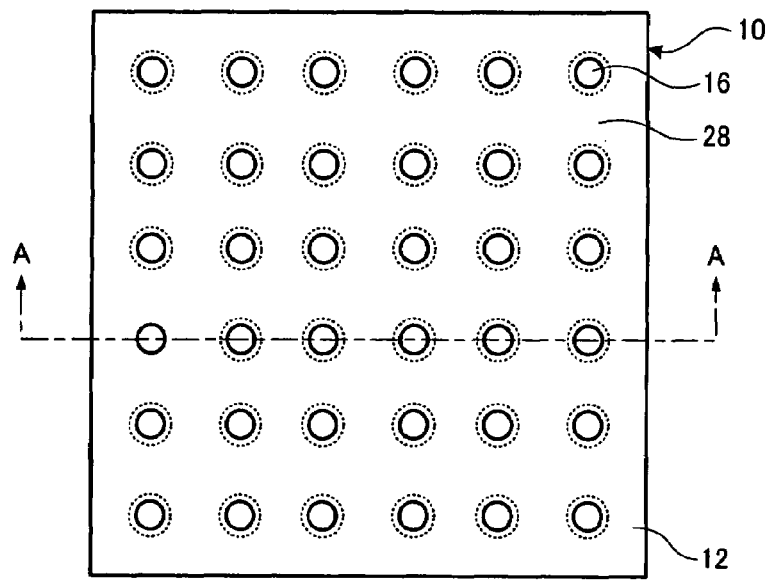
FIG. 1B is a plan view showing the configuration of the wiring board according to the first embodiment of the present invention as viewed from an external connection terminal side.
Figure 1C:
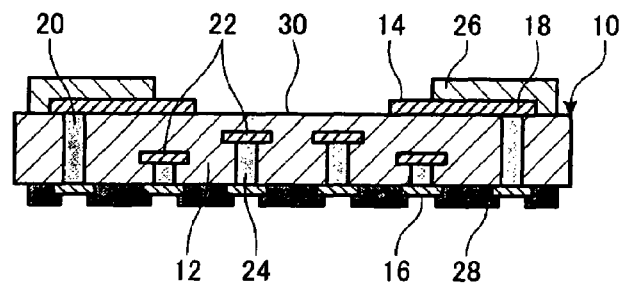
FIG. 1C is a sectional view taken along line A-A in FIGS. 1A and 1B and showing the configuration of the wiring board according to the first embodiment of the present invention.

FIG. 1A is a plan view showing the configuration of a wiring board according to a first embodiment of the present invention as viewed from a semiconductor mounting area side. FIG. 1B is a plan view of the wiring board as viewed from an external connection terminal side. FIG. 1C is a sectional view taken along line A-A in FIGS. 1A and 1B.

In the present embodiment, a wiring board 10 comprises a planar resin base material 12, element connection terminals 14, external connection terminals 16, a first resin film 26, and a second resin film 28. The element connection terminals 14 are arranged in a semiconductor element mounting area 30 formed on a first surface of the resin base material 12 and in an area around the periphery of the semiconductor element mounting area 30.

The external connection terminals 16 are arranged on a second surface of the resin base material 12. The element connection terminals 14 and the external connection terminals 16 are electrically connected together via wiring patterns 18, 22 and inner vias 24 built into the resin base material 12 as well as through conductors 20 penetrating the resin base material 12.

The first resin film 26 is formed on the first surface of the resin base material 12 and shaped so as to expose the element connection terminals 14. The second resin film 28 is formed on the second surface of the resin base material 12 and shaped so as to expose the external connection terminals 16. In the present embodiment, the external connection terminals 16 are arranged in an array on the second surface of the resin base material 12.

The first resin film 26 and the second resin film 28 are different in at least one of a glass transition point, cure shrinkage, and a thermal expansion coefficient. Specifically, the first resin film 26 has a greater cure shrinkage and thermal expansion coefficient than the second resin film 28.

Both the first resin film 26 and the second resin film 28 are formed using an epoxy resin as a resin component. Inorganic particles are used as a filler contained in the first resin film 26 and a filler contained in the second resin film 28. To make a difference in thermal expansion coefficient between the first resin film 26 and the second resin film 28, the amount of filler contained in the first resin film 26 is set smaller than that of filler contained in the second resin film 28. The resin component of the first resin film 26 and second resin film 28 may be a polyimide resin.

The present embodiment will be described in conjunction with the case where a glass epoxy resin, typified by FR-4, is used as the resin base material 12. However, the resin base material 12 may be one type of resin selected from a glass epoxy resin, an epoxy resin, a bismaleimide-triazine resin (BT resin), an acrylic butadiene styrene resin (ABS resin), a polyimide resin, a polyamide resin, and an acrylic resin.

The resin base material 12 may have a square external shape and a thickness of about 40 to 500 μm. However, the resin base material 12 preferably has a thickness of at most 200 μm in order to provide a thin semiconductor device.

The element connection terminals 14 and external connection terminals 16, formed on the resin base material 12, are formed, for example, as follows. First, a conductor film such as copper (Cu) is deposited directly on a surface of the resin base material 12 using electroplating, electroless plating, or both. Alternatively, a conductor foil such as a copper foil which serves as a conductor film is stuck to a surface of the resin base material 12 using an adhesive. The conductor film preferably has a thickness set at 5 to 50 μm, more preferably at about 15 μm in view of pattern processability. The conductor film thus formed is patterned by, for example, etching.

Then, a film composed of two layers of nickel (Ni) and gold (Au) is formed on the conductor film using electroplating, electroless plating, or the like. The thicknesses of these layers are such that the nickel layer has a thickness of 1 to 10 μm, preferably of 3 μm and such that the gold layer has a thickness of 0.01 to 0.1 μm, preferably of 0.05 μm. The film composed of the two layers of nickel (Ni) and gold (Au) is not essential. The film need not be formed if for example, the semiconductor element is mounted on the resin wiring board by soldering.

Then, the first resin film 26 is formed on the first surface of the resin base material 12. The second resin film 28 is formed on the second surface. These films have a thickness set at 5 to 70 μm and more preferably at about 15 to 40 μm in view of pattern processability.

The first resin film 26 and the second resin film 28 will be described below. In the present embodiment, both the first resin film 26 and the second resin film 28 use an epoxy resin as a resin component and use silica particles as a filler.

The addition amount of the filler is 5 to 10 wt % for the first resin film 26 and 30 to 50 wt % for the second resin film 28. Addition of more silica particles, the filler, enables a reduction in thermal expansion coefficient and cure shrinkage. However, the addition amount of the filler exceeding 50 wt % reduces resolution based on ultraviolet irradiation. Thus, the present embodiment sets the addition amount of the filler at a maximum of 50 wt % for the second resin film 28.

By thus varying the addition amount of the filler between the first resin film 26 and the second resin film 28, it is possible to make the thermal expansion coefficient and cure shrinkage of the second resin film 28 smaller than those of the first resin film 26. Further, the addition of a relatively large amount of filler made of silica particles degrades the absorbing property of the second resin film 28.

The second resin film 28 has a relatively simple pattern as shown in the figure, and the external connection terminals 16 have a large pitch. The second resin film 28 may thus be formed, for example, in accordance with a screen printing scheme. In this case, pattern processing based on an exposure process and an etching process is unnecessary. This enables an increase in filler addition amount to about 90 wt % and thus a reduction in thermal expansion coefficient and cure shrinkage.

The filler is not limited to the silica particles. The filler is not particularly restricted provided that the material is inorganic and offers an insulating property. For example, aluminum silicate particles, titanium oxide particles, aluminum oxide particles, or zirconium oxide particles may be used as a filler. Moreover, the filler added to the first resin film 26 and the filler added to the second resin film 28 may be composed of different materials.

As shown in FIGS. 1A, 1B, and 1C, in the wiring board 10 according to the present embodiment, the formation area of the second resin film 28 is larger than that of the first resin film 26. However, the thermal expansion coefficient and cure shrinkage of the second resin film 28 are set smaller than those of the first resin film 26. This enables a reduction in the possible warpage of the wiring board 10 even after curing.

Figure 2:
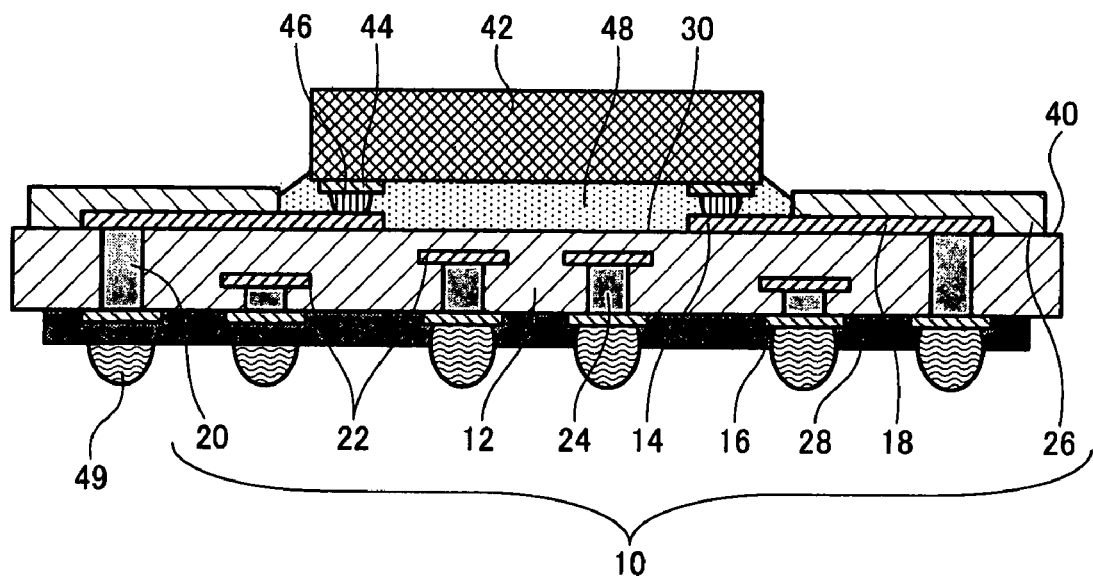
FIG. 2 is a sectional view showing the configuration of a semiconductor device produced using the wiring board according to the first embodiment.

FIG. 2 is a sectional view showing the configuration of a semiconductor device 40 produced using the resin wiring board 10 according to the present embodiment. The semiconductor device 40 has a BGA configuration having the resin wiring board 10, a semiconductor element 42, and connecting projection electrodes 49 provided on the external connection electrodes 16, with the semiconductor element 42 mounted in the semiconductor element mounting area 30 formed on the first surface of the wiring board 10.

The external connection terminals 16 are arranged in an array on the second surface of the resin base material 12. The connecting projection electrodes 49 are provided on the respective external connection terminals 16. The connecting projection electrodes 49 may be, for example, solder balls.

The semiconductor element 42 forms projection electrodes 46 on electrode terminals 44. The electrode terminals 44 are connected to the connection terminals 14 on the resin wiring board 10 via the projection electrodes 46. Moreover, the semiconductor element 42 is bonded to the resin wiring board 10 by a sealing resin 48.

This configuration enables a reduction in the possible warpage of the entire semiconductor device 40 with the connecting projection electrodes 49 connected to the external connection terminals 16. This makes it possible to reliably prevent inappropriate connections when the semiconductor device 40 is mounted on a circuit board such as a mother board. This in turn results in the unlikelihood of inappropriate connections, improving the reliability of the semiconductor device 40.

A description will be given of the results obtained by studying the effect of reducing the possible warpage of the wiring board.

In Experiment Example 1, the resin wiring board 10 was produced with 5 to 10 wt % of filler added to the first resin film 26 and 30 to 50 wt % of filler added to the second resin film 28.

In Comparative Example 1, a resin wiring board was produced with 30 to 50 wt % of filler added to both the first and second resin films.

In Comparative Example 2, a resin wiring board was produced with 5 to 10 wt % of filler added to both the first and second resin films.

The three types of samples were heated at a soldering temperature. The amount of warpage having occurred in the wiring board was measured. The predetermined amount of warpage with which the wiring board can be normally mounted on a mother board was defined as a reference value. The measured value of the amount of warpage in each sample was compared with the reference value. Wiring boards exhibiting a warpage amount greater than the reference value were determined to be defective. Thus, an efficiency percentage was determined which indicated the number of wiring boards exhibiting a warpage amount smaller than the reference value. The number of samples in each of Experiment Example 1, Comparative Example 1, and Comparative Example 2 was 25.

The results of the above experiments will be described. Experiment Example 1 exhibited an efficiency percentage of 100%. On the other hand, Comparative Example 1 exhibited a slightly reduced average value of the warpage amount but an efficiency percentage of 75%. Comparative Example 2 exhibited an increased average value of the warpage amount with an efficiency percentage of 36%. These results indicate that the configuration according to the present invention enables a reduction in the amount of warpage of the wiring board, allowing the wiring board to be reliably mounted on a mother board.

Instead of adjusting the addition amount of the filler, fillers of different materials may be added or different resin components may be used to control the thermal expansion coefficient, cure shrinkage, and glass transition point. These measures allow the warpage amount to be reduced by setting the properties of the first and second resin films in accordance with the configuration of the resin wiring board.

For example, a polyimide resin may be used as the resin component of the first resin film, whereas an epoxy resin may be used as the resin component of the second resin film, or vice versa. Alternatively, alumina particles may be used as the filler added to the first resin film, and silica particles may be used as the filler added to the second resin film.

Now, a description will be given of a manufacturing process of producing the semiconductor device 40 of the BGA configuration using the above wiring board 10. FIG. 3 is a diagram illustrating a process of producing the semiconductor device using the resin wiring board according to the present embodiment.

Figure 3A:
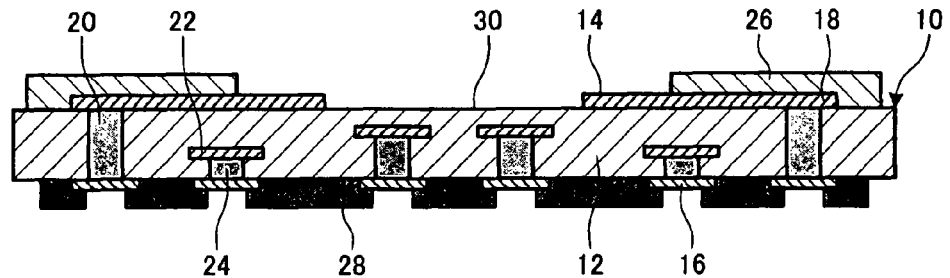
FIGS. 3A to 3D are diagrams illustrating a process of producing a semiconductor device using the wiring board according to the first embodiment.

First, as shown in FIG. 3A, the resin wiring board 10, which is similar to that described in FIGS. 1A to 1C, is prepared. The wiring board 10 is produced, for example, as described below.

Copper foils are stuck to the opposite surfaces of a resin base material 12 with a wiring pattern 22 and inner vias 24 formed therein. The resin base material 12 has a thickness of 40 to 400 μm, more desirably of about 200 μm. Subsequently, through conductors 20 penetrating the resin base material 12 are formed and copper foils are stuck to the resin base material. The copper foils are then etched, and appropriate areas are plated with gold or the like.

The through conductors 20 are formed by forming through-holes in the resin base material 12 by, for example, drilling or laser irradiation, and plating the through-holes to form plated conductors or the like for conductance. The plated conductor may be composed of, for example, a single layer, two layers, or three layers.

For example, the single layer configuration has a single copper (Cu) or gold (Au) layer formed, using electroplating or electroless plating, to have a thickness of 5 to 50 μm, preferably 20 μm. The two-layer configuration has two layers formed therein by depositing copper (Cu) and nickel (Ni). The three-layer configuration has three layers formed therein by depositing gold (Au), copper (Cu), and nickel (Ni).

The element connection terminals 14, the wiring pattern 18, the external connection terminals 16, and the like are formed as described above. Then, the first resin film 26 is formed on the first surface of the resin base material 12, whereas the second resin film 28 is formed on the second surface.

The first resin film 26 and the second resin film 28 may be formed, for example, in accordance with the screen printing scheme or by applying a liquid resin all over the surface of the resin base material 12 and then using the exposure process and etching process to process the base material into a predetermined shape.

The first resin film 26 is preferably formed by the exposure process and etching process. On the other hand, the second resin film 28 may be formed using either the exposure process and etching process or the screen printing scheme. The use of the screen printing scheme not only simplifies the whole process but also enables the use of a resin material that is insensitive to light. This increases the degree of freedom of the selection of a material for the second resin film 28.

Figure 3B:
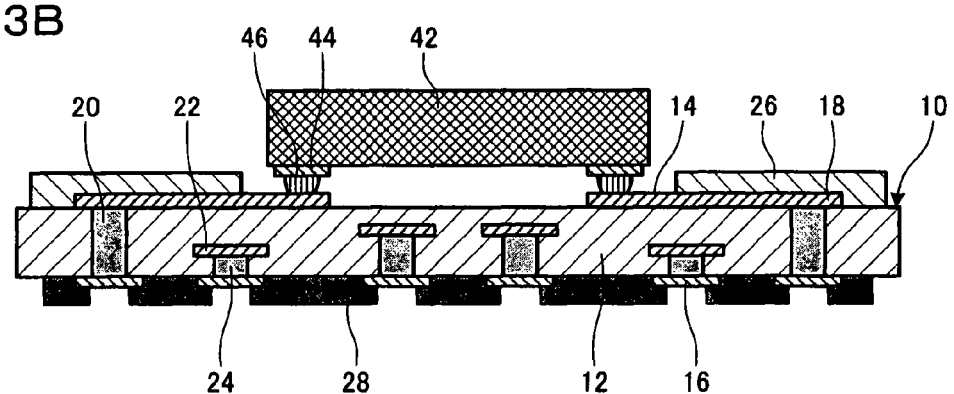

Then, as shown in FIG. 3B, the semiconductor element 42 is mounted on the semiconductor element mounting area 30 of the wiring board 10. The electrode terminals 44 and the connection terminals 14 are connected together via the projection electrodes 46. The connection is performed as follows.

A solder paste (not shown) is formed at a predetermined position on each of the connection terminals 14 by printing with a metal mask. The projection electrode 46 of each electrode terminal 44 on the semiconductor element 42 is temporarily fixed to the corresponding solder paste.

Subsequently, for example, a reflow furnace is used to heat the wiring board 10 to melt the solder pastes. The electrode terminals 44 and the connection terminals 14 are thus electrically and mechanically connected together via the projection electrodes 46 and the solder pastes. The heating temperature in the reflow furnace depends on the material of the solder paste. For example, if the solder paste is composed of silver (Ag), copper (Cu), and stannum (Sn), the wiring board 10 needs to be heated to about 240° C.

The connection between the projection electrode 46 of the electrode terminal 44 and the corresponding connection terminal 14 is not limited to the above method. Another junction method such as the one described below may be used. For example, a conductive resin paste containing a silver (Ag) filler is applied to the projection electrode 46. With the projection electrode 46 in contact with the corresponding connection terminal 14 on the resin wiring board 10, the wiring board 10 is heated between 170 and 200° C. to cure the resin paste to connect the projection electrode 46 and the connection terminal 14 together.

Figure 3C:
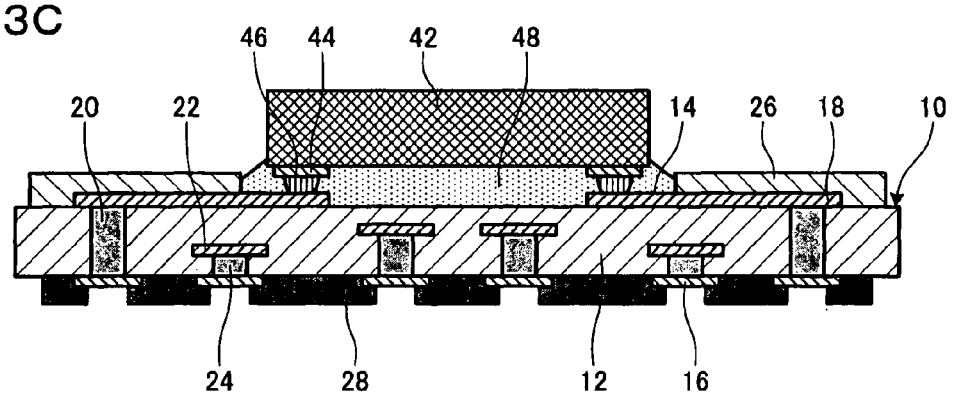

Then, as shown in FIG. 3C, the sealing resin 48 is injected into the gap between the resin base material 12 of the wiring board 10 and the semiconductor element 42. The wiring board 10 is then heated to cure the sealing resin 48. The sealing resin 48 is a liquid resin containing, for example, an epoxy resin as a base resin mixed with at least a curing agent and a cure shrinkage regulator. The sealing resin 48 exhibits a low viscosity enough to be injected into the gap between the resin base material 12 and the semiconductor element 42.

The liquid resin is cured by being heated between 160 and 210° C., preferably at about 180° C. The curing time may be appropriately set depending on the shape of a curing apparatus or the like.

Figure 3D:
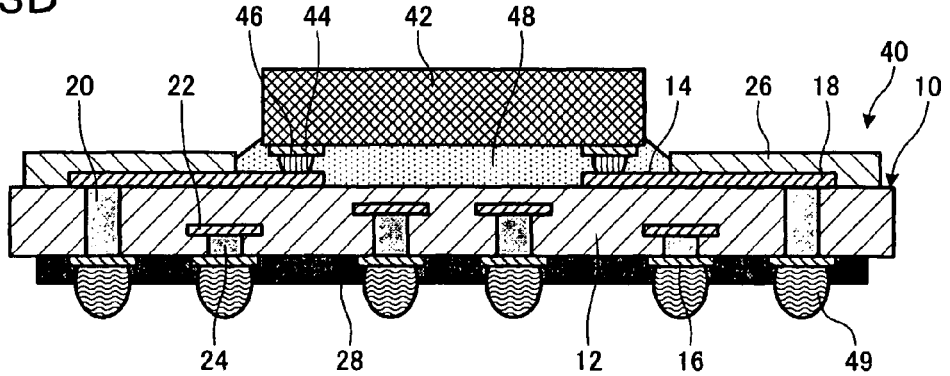

Then, as shown in FIG. 3D, the connecting projection electrode 49 made of, for example, a stannum (Sn)-silver (Ag)-copper (Cu) alloy is placed on the corresponding external connection terminal 16 formed on the second surface of the resin base material 12. Subsequently, the wiring board is heated to about 240° C. to join the connecting projection electrode 49 to the corresponding external connection terminal 16. This results in the semiconductor device 40 of the BGA configuration according to the present embodiment.

Second Embodiment

Figure 4A:
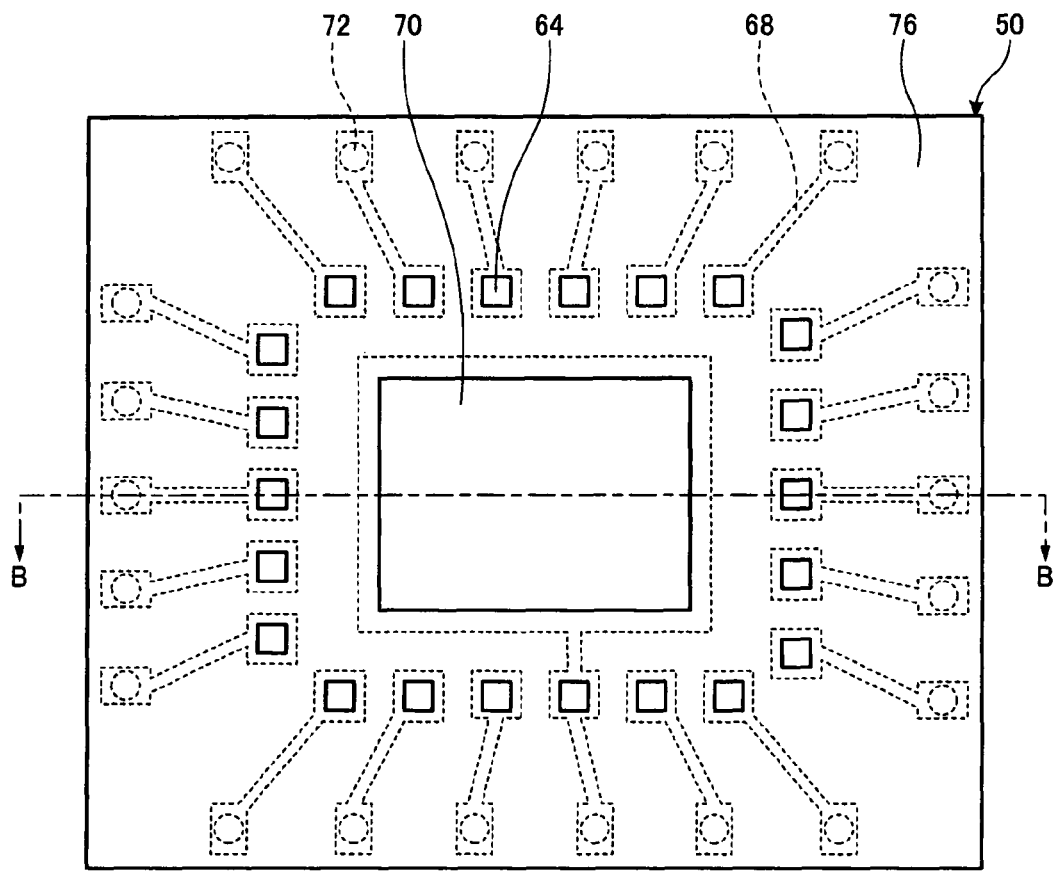
FIG. 4A is a plan view showing the configuration of a wiring board according to a second embodiment of the present invention as viewed from a semiconductor element mounting side.
Figure 4B:
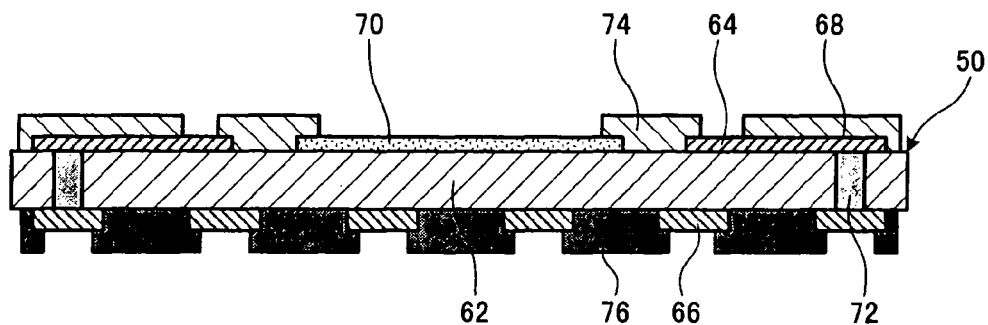
FIG. 4B is a sectional view taken along line B-B in FIG. 4A and showing the configuration of the wiring board according to the second embodiment of the present invention.

FIG. 4A is a plan view showing the configuration of a resin wiring board according to a second embodiment of the present invention, as viewed from a semiconductor element mounting side. FIG. 4B is a sectional view taken along line B-B in FIG. 4A.

A wiring board 50 is configured so that a semiconductor element (not shown) is mounted on the wiring board 50 by wire bonding. Element connection terminals 64, a wiring pattern 68, and a die pattern 70 are formed on a first surface of a resin base material 62. A first resin film 74 is formed so as to expose predetermined portions of the element connection terminals 64 and the die pattern 70, while covering the other areas.

External connection terminals 66 are formed on a second surface of the resin base material 62. A second resin film 76 is formed so as to expose the external connection terminals 66, while covering the other areas. Through conductors 72 are formed at predetermined positions in the resin base material 62 so as to penetrate the resin base material 62. The through conductors 72 electrically connect the external connection terminals 66 to the wiring pattern 68. The element connection terminals 64 and the external connection terminals 66 are electrically connected together via the wiring pattern 68 and the through conductors 72.

Here, the first resin film 74 and the second resin film 76 are formed of a material similar to that described for the resin wiring board 10 according to the first embodiment. Accordingly, also in the wiring board 50 according to the present embodiment, the thermal expansion coefficient and cure shrinkage of the second resin film 76 are set smaller than those of the first resin film.

Further, as shown in FIG. 4B, the area of the second resin film 76 is larger than that of the first resin film 74, but the thermal expansion coefficient and cure shrinkage of the second resin film 28 are smaller than those of the first resin film 26. This enables a reduction in the amount of possible warpage of the wiring board 10 after curing the resin film.

Figure 5A:
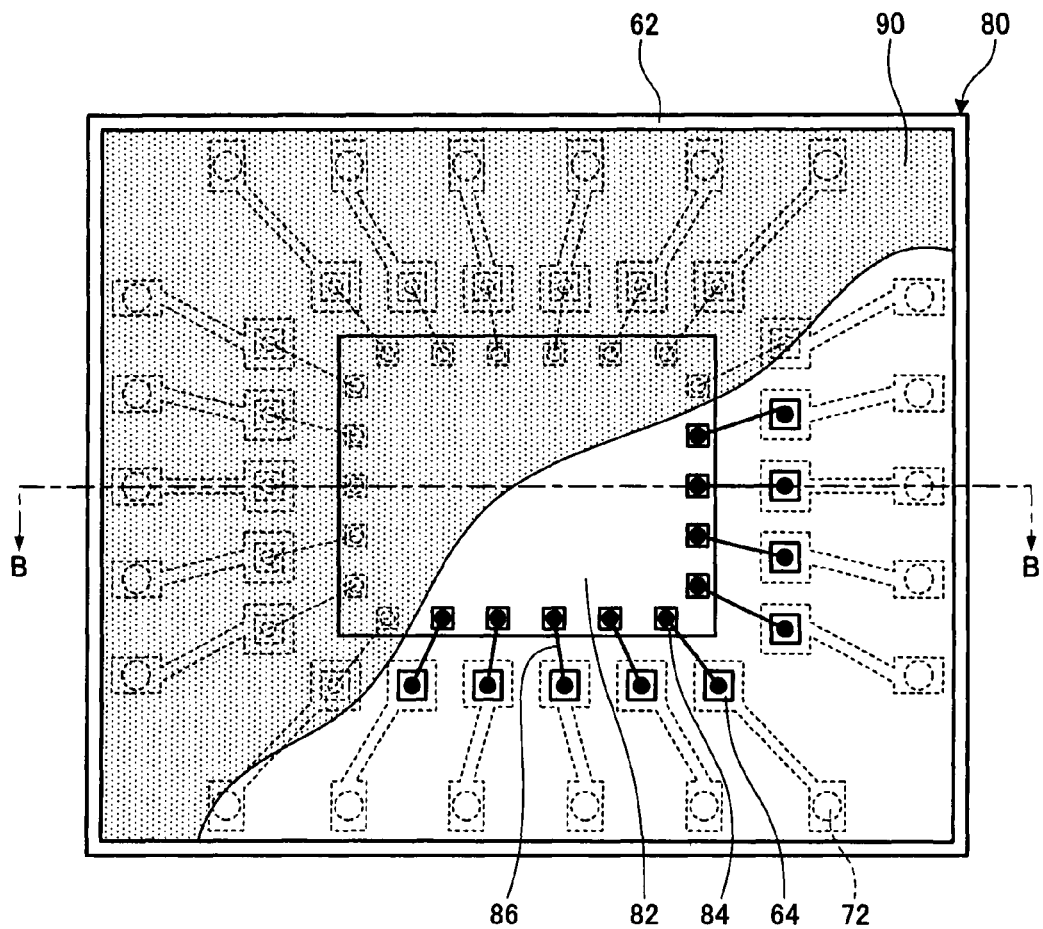
FIG. 5A is a plan view showing the configuration of a semiconductor device constructed using the wiring board according to the second embodiment as viewed from a semiconductor element side.
Figure 5B:
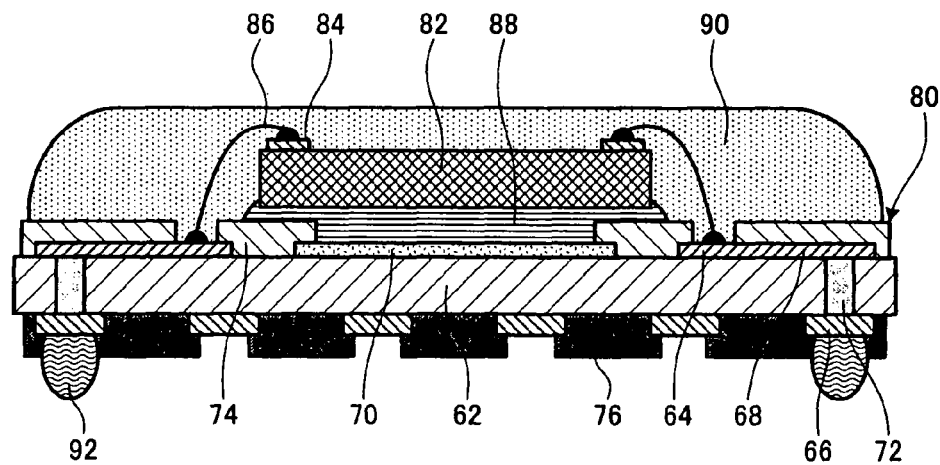
FIG. 5B is a sectional view taken along line B-B in FIG. 5A and showing the configuration of the wiring board according to the second embodiment of the present invention.

FIG. 5A is a plan view showing a semiconductor device 80 constructed using the wiring board 50, as viewed from a semiconductor element side. FIG. 5B is a sectional view taken along line B-B in FIG. 5A.

A semiconductor element 82 is bonded to a die pattern 70 on the wiring board 50 using a conductive adhesive 88. Electrode terminals 84 on the semiconductor element 82 are connected to the element connection terminals 64 on the resin wiring board 50 via thin metal wires 86. A sealing resin 90 is formed over the semiconductor element 82 and the thin metal wires 86. Connecting projection electrodes 92 are formed on the external connection terminals 66 on the wiring board 50 and made of, for example, solder balls. The connecting projection electrodes 92 allow the wiring board to be mounted on a mother board by solder reflowing.

With the semiconductor device 80 using the wiring board 50 according to the second embodiment, the wiring board 50 itself may be warped only by a small amount, allowing the semiconductor element 82 to be fixedly bonded. Even with the sealing resin 90 formed after mounting of the semiconductor element 82, the amount of possible warpage of the semiconductor device 80 as a whole can be minimized.

Third Embodiment

Figure 6A:
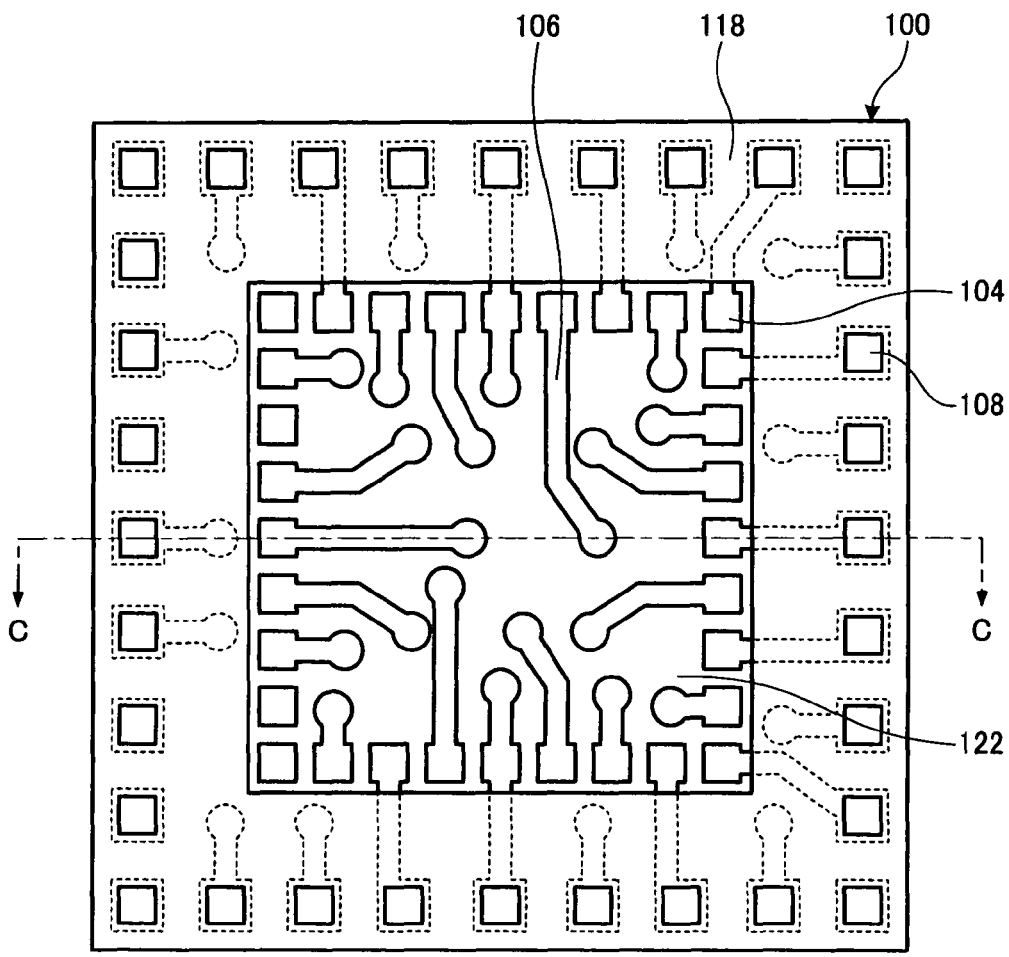
FIG. 6A is a plan view showing the configuration of a first wiring board according to a third embodiment of the present invention as viewed from a semiconductor element mounting side.
Figure 6B:
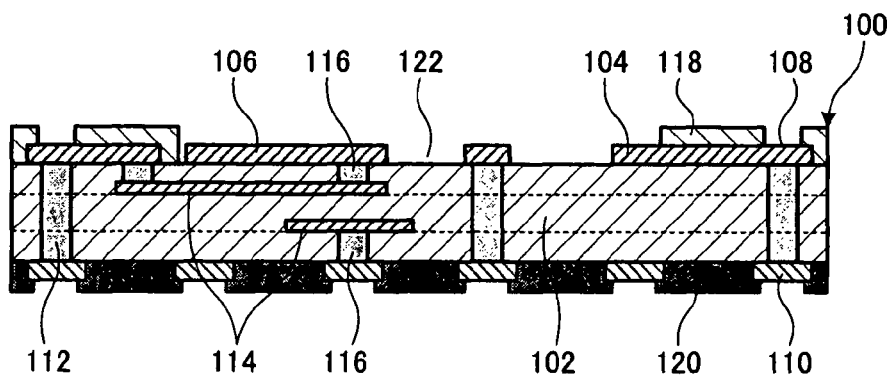
FIG. 6B is a sectional view taken along line C-C in FIG. 6A and showing the configuration of the first wiring board according to the third embodiment of the present invention.
Figure 7A:
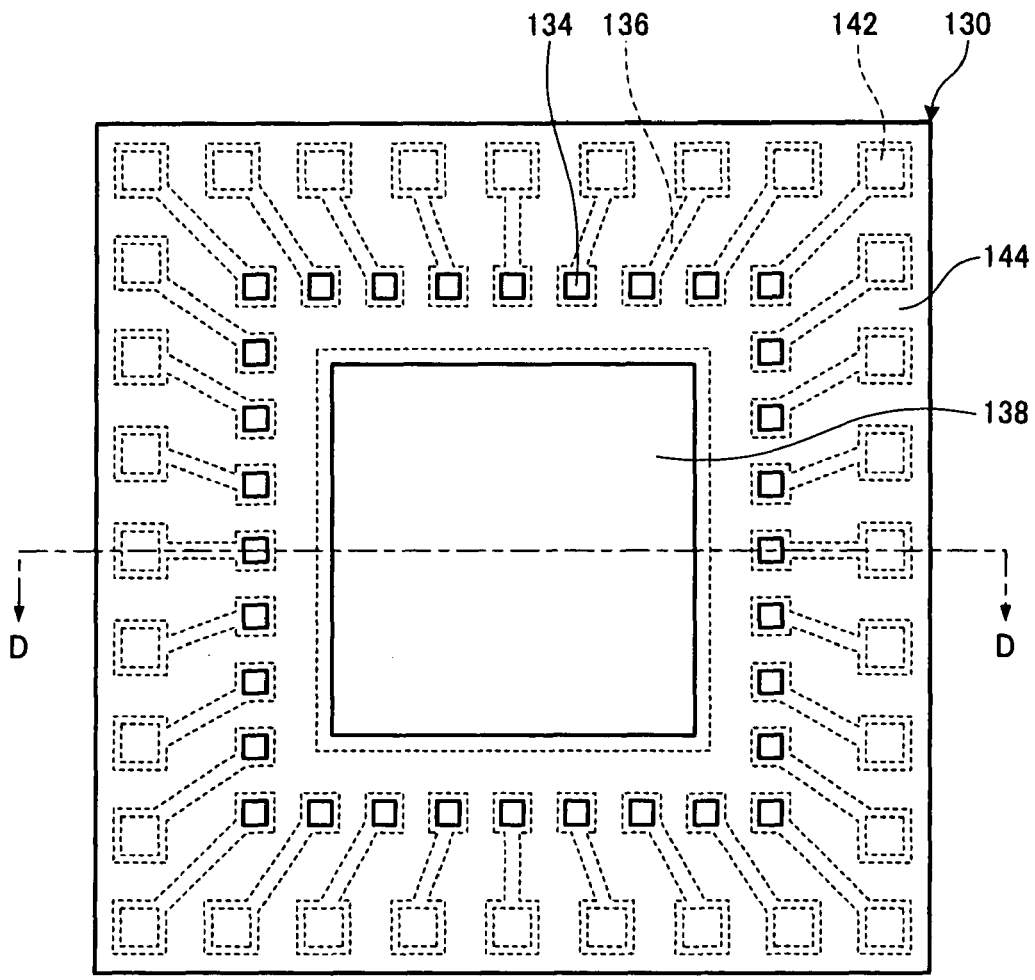
FIG. 7A is a plan view showing the configuration of a second wiring board according to the third embodiment of the present invention as viewed from a semiconductor element mounting side.
Figure 7B:
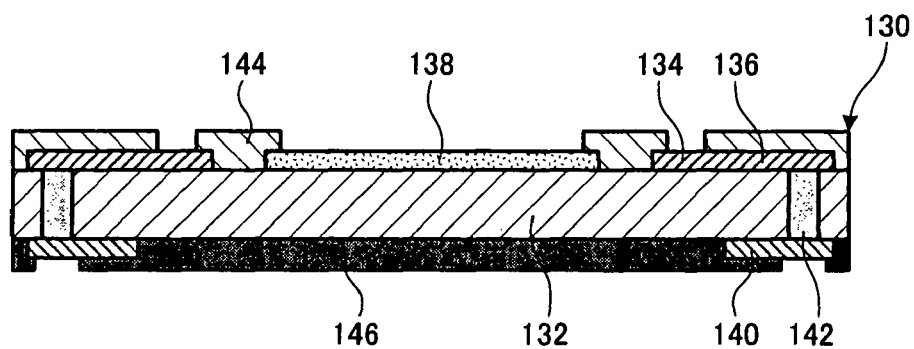
FIG. 7B is a sectional view taken along line D-D in FIG. 7A and showing the configuration of the second wiring board according to the third embodiment of the present invention.

FIGS. 6A, 6B, 7A, and 7B show the configuration of a resin wiring board according to a third embodiment of the present invention, which is mainly used for a stacked semiconductor device. FIGS. 6A and 7A are plan views of the wiring board as viewed from a semiconductor element mounting side. FIG. 6B is a sectional view taken along line C-C in FIG. 6A. FIG. 7B is a sectional view taken along line D-D in FIG. 7A.

In the description below, a wiring board shown in FIGS. 6A and 6B is referred to as a first wiring board 100. A wiring board shown in FIGS. 7A and 7B is referred to as a second wiring board 130.

As shown in FIGS. 6A and 6B, the first resin wiring board 100 comprises a planar resin base material 102, element connection terminals 104, external connection terminals 110, a first resin film 118, and a second resin film 120. The element connection terminals 104 are arranged inside a semiconductor element mounting area 122 formed on a first surface of the resin base material 102. The external connection terminals 110 are arranged in an array on a second surface of the resin base material 102 and electrically connected to the element connection terminals 104. The first resin film 118 is formed so as to cover the first surface of the resin base material 102, while exposing the element connection terminals 104, the wiring pattern 106, and the stacking connection terminals 108. The second resin film 120 is formed so as to cover the second surface of the resin base material 102, while exposing the external connection terminals 110.

The wiring pattern 106 and element connection terminals 104, formed on the first surface of the resin base material 102, are electrically connected together by a wiring pattern 114 and inner vias 116 built into the resin base material 102. The element connection terminals 104 and the external connection terminals 110 are electrically connected together by through conductors 112 provided at predetermined positions of the resin base material 102. A wiring pattern may be formed on the second surface of the resin base material 102 as required.

The stacking connection terminals 108 are provided in an area around the outer periphery of a semiconductor element mounting area 122 of the wiring board 100 and connected to the second resin wiring board 130.

The first resin film 118 and the second resin film 120 are made of materials differing in at least one of the glass transition point, cure shrinkage, and thermal expansion coefficient. In this case, the cure shrinkage of the first resin film 118 is set greater than that of the second resin film 120. The thermal expansion coefficient of the first resin film 118 is set greater than that of the second resin film 120.

Thus, inorganic particles are used as a filler contained in the first resin film 118 and as a filler contained in the second resin film 120. The amount of filler contained in the first resin film 118 is set smaller than that of filler contained in the second resin film 120. In the present embodiment, the resin component of the first resin film 118 is made of an epoxy resin. The resin component of the second resin film 120 is made of a polyimide resin.

A glass epoxy resin, often used for circuit boards with multilayer wiring or the like, is used as the resin base material 102 according to the present embodiment. However, it is possible to use one type of resin selected from any of other epoxy reins, a bismaleimide-triazine resin (BT resin), an acrylic butadiene styrene resin (ABS resin), a polyimide resin, a polyamide resin, and an acrylic resin.

As shown in FIGS. 7A and 7B, the basic configuration of the second wiring board 130 is the same as that of the first resin wiring board 100, shown in FIGS. 6A and 6B. The second wiring board 130 has element connection terminals 134 and a wiring pattern 136 formed on a first surface of a resin base material 132. The wiring pattern 136 is electrically connected to external connection terminals 140 formed on a second surface of the resin base material 132, by through conductors 142 provided at predetermined positions of the resin base material 132.

The second resin wiring board 130 has a die pattern 138 formed in an area in which a semiconductor element (not shown) is mounted. A first resin film 144 is formed so as to cover the first surface of the resin base material 132, while exposing predetermined portions of the die pattern 138 and element connection terminals 134. In the second resin wiring board 130, the area in which the die pattern 138 is formed and a nearby area thereof collectively constitute a semiconductor element mounting area.

The external connection terminals 140 are formed on the second surface of the resin base material 132. As described above, the external connection terminals 140 and the element connection terminals 134 are electrically connected together via the wiring pattern 136 and the through conductors 142. A second resin film 146 covering the second surface of the resin base material 132 is formed so as to expose predetermined portions of the external connection terminals 140. Materials and production methods for the first resin film 144 and the second resin film 146 are the same as those for the first wiring board 100 and will thus not be described below.

The external connection terminals 140 on the second wiring board 130 are provided at positions corresponding to the stacking connection terminals 108 on the first wiring board 100. That is, while the external connection terminals 110 on the first wiring board 100 are arranged in an array, the external connection terminals 138 on the second wiring board 130 are arranged only in an outer peripheral area of the resin base material 132.

Even in the first wiring board 100 and second wiring board 130 configured as described above, the second resin films 120, 146 have smaller thermal expansion coefficient and cure shrinkage than the first resin films 118, 144. This enables a reduction in the amount of possible warpage of the first wiring board 100 and the second wiring board 130.

Figure 8A:
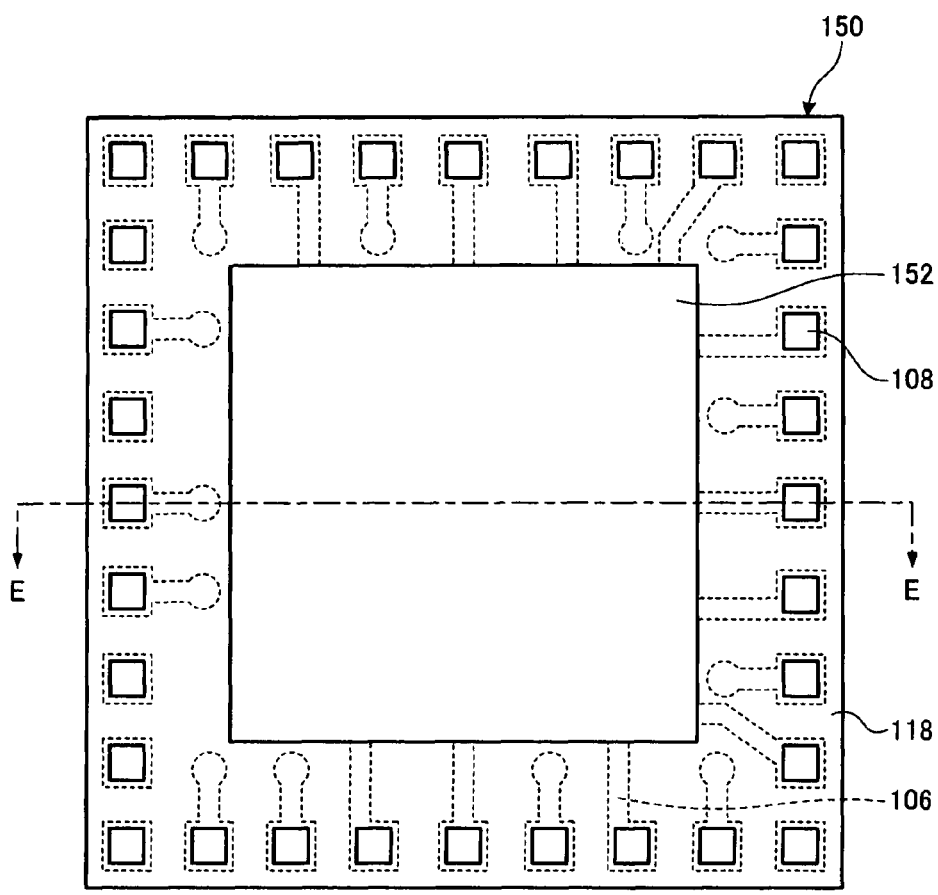
FIG. 8A is a plan view showing a semiconductor device constructed using the first wiring board according to the third embodiment of the present invention as viewed from the semiconductor element mounting side.
Figure 8B:
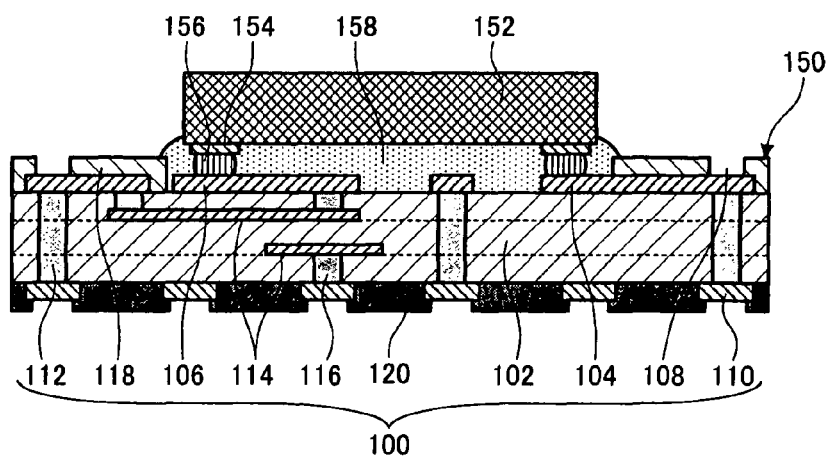
FIG. 8B is a sectional view taken along line E-E in FIG. 8A and showing the semiconductor device constructed using the first wiring board according to the third embodiment of the present invention.
Figure 9A:
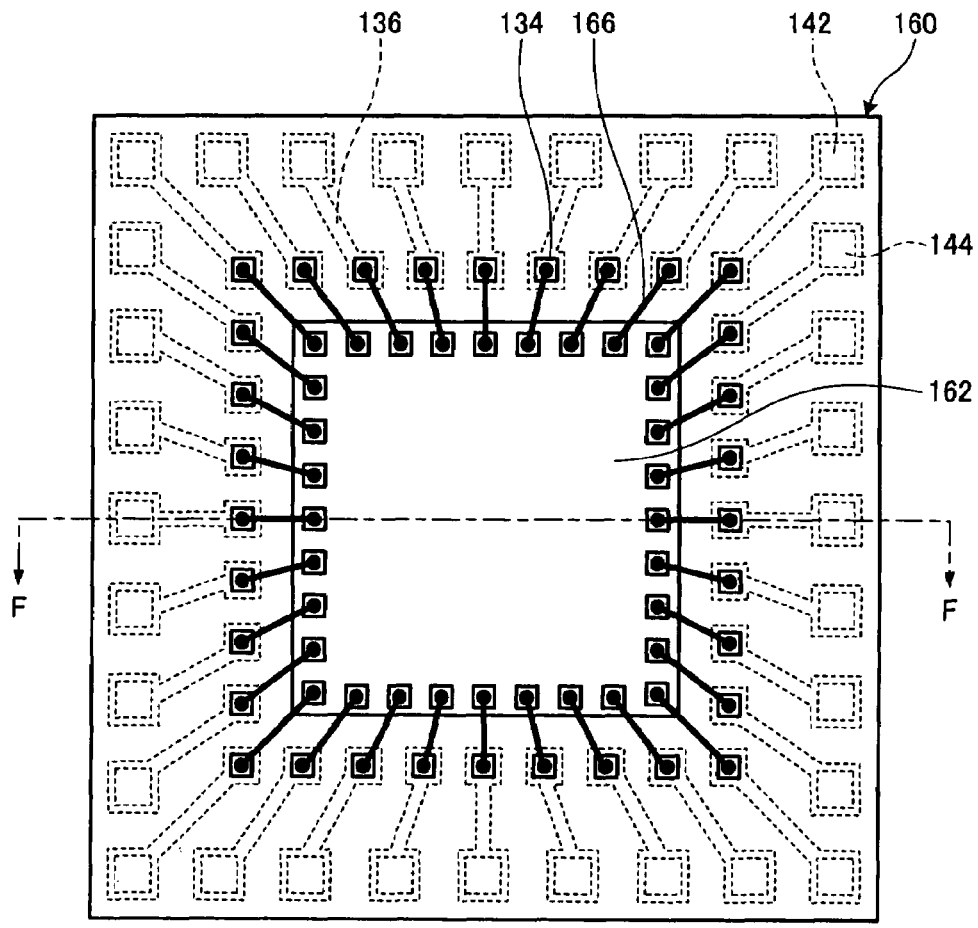
FIG. 9A is a plan view showing a semiconductor device constructed using the second wiring board according to the third embodiment of the present invention as viewed from the semiconductor element mounting side.
Figure 9B:
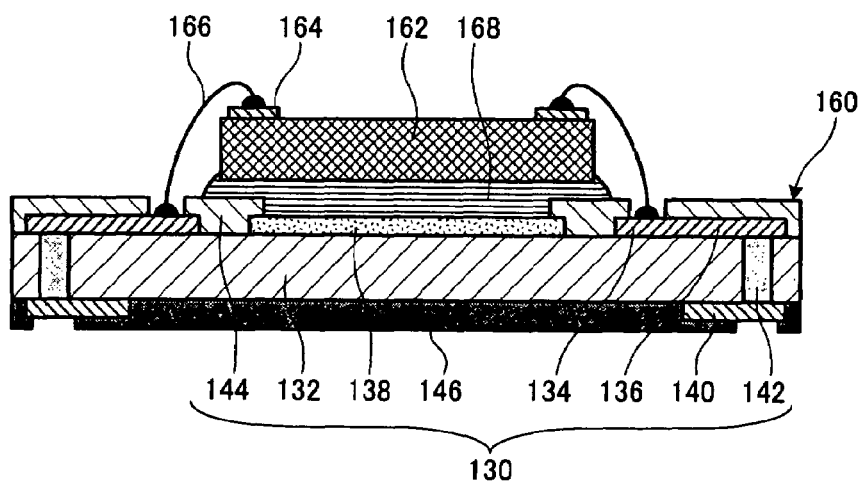
FIG. 9B is a sectional view taken along line F-F in FIG. 9A and showing the semiconductor device constructed using the second wiring board according to the third embodiment of the present invention.

FIG. 8A is a plan view showing a semiconductor device constructed using the first wiring board 100, as viewed from a semiconductor element mounting side. FIG. 8B is a sectional view taken along line E-E in FIG. 8A. FIG. 9A is a plan view showing a semiconductor device constructed using the second resin wiring board 130, as viewed from a semiconductor element mounting side. FIG. 9B is a sectional view taken along line F-F in FIG. 9A.

In the description below, a semiconductor device shown in FIGS. 8A and 8B is referred to as a first semiconductor device 150. A semiconductor device shown in FIGS. 9A and 9B is referred to as a second semiconductor device 160.

As shown in FIGS. 8A and 8B, the first semiconductor device 150 has a semiconductor element 152 mounted on the semiconductor element mounting area 122 of the first wiring board 100 and bonded to the first wiring board 100 by a sealing resin 158. The semiconductor element 152 has projection electrodes 156 formed on electrode terminals 154 and connected to the element connection terminals 104 on the first wiring board 100 via the projection electrodes 156.

The first semiconductor device 150 can be used in the above state. In this case, for example, solder balls are joined to the external connection terminals 110 as the connecting projection electrodes 49. The first semiconductor device 150 is thus used as a semiconductor device of the BGA configuration.

The first semiconductor device 150 is configured as described above using the first wiring board 100, which may be warped only by a small amount. This enables a reduction in the amount of possible warpage of the semiconductor device 150 as a whole. Consequently, even when the semiconductor device 150 is mounted on a circuit board such as a mother board, possible inappropriate connections can be reliably prevented. Moreover, if a stacked semiconductor device is to be implemented as described below, the semiconductor device 150 facilitates the mounting step and improves reliability.

As shown in FIGS. 9A and 9B, a second semiconductor device 160 has a semiconductor element 162 mounted on the die pattern 138 on the second wiring board 130 and bonded to the second wiring board 130 with a conductive adhesive 168. The semiconductor element 162 has electrode terminals 164 connected to element connection terminals 134 on the second wiring board 130 via thin metal wires 166. The second semiconductor device 160 has a sealing resin formed so as to cover the semiconductor elements 162 and the thin metal wires 166. However, FIGS. 9A and 9B do not show the sealing resin.

In the second semiconductor device 160 configured as described above, the reduced amount of possible warpage of the second wiring board 130 facilitates the fixed bonding of the semiconductor element 162. Further, even after the sealing resin is formed after mounting steps such as wire bonding following mounting of the semiconductor element 162 on the second wiring board 130, the possible warpage of the semiconductor device as a whole can be reduced. This enables the implementation of a thin semiconductor device that can be easily mounted on a mother board or the like.

Figure 10:
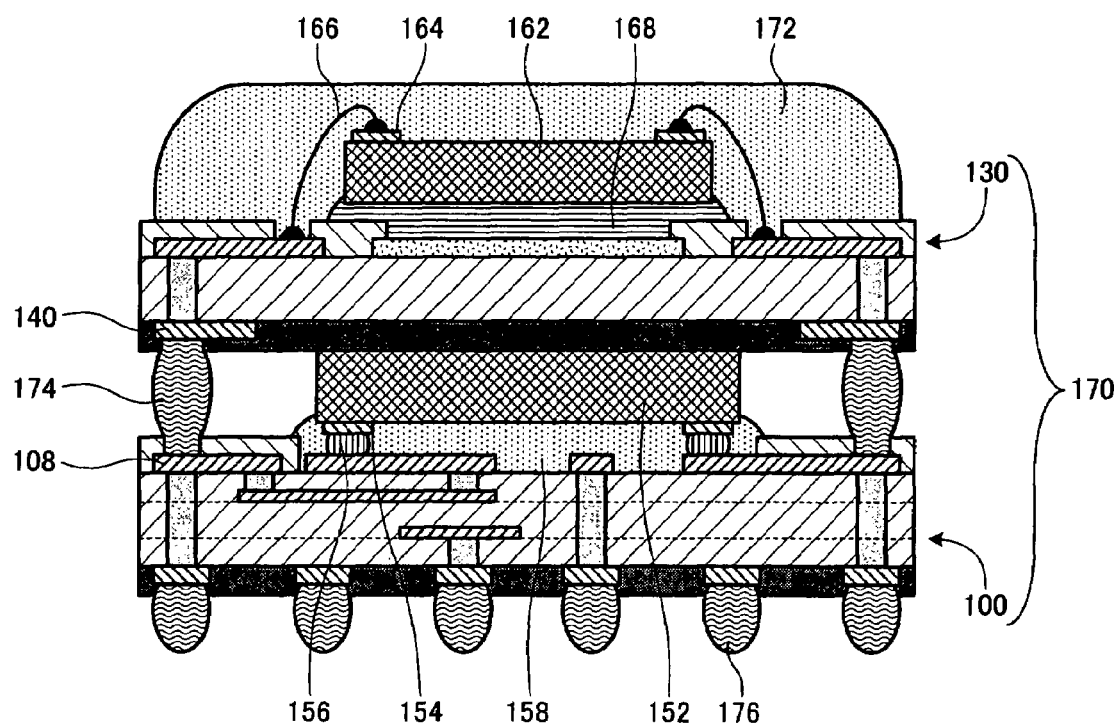
FIG. 10 is a sectional view of a semiconductor device constructed by stacking a first semiconductor device and a second semiconductor device according to the third embodiment of the present invention.

FIG. 10 is a sectional view of a semiconductor device 170 constructed by stacking the first semiconductor device 150 and the second semiconductor device 160 on each other.

As shown in FIG. 10, in the semiconductor device 170, the second semiconductor device 160 is mounted on the first semiconductor device 150. The stacking connection terminals 108 provided on the first wiring board 100 of the first semiconductor device 150 are connected to the external connection terminals 140 on the second wiring board 130 of the second semiconductor device 160 via the stacking projection electrodes 174. The stacking projection electrodes 174 may be, for example, solder bumps, or metal columns or balls having solder films formed on the surfaces thereof.

Also in this stacked configuration, the first semiconductor device 150 and the second semiconductor device 160 may be warped only by a small amount. This makes inappropriate connections unlikely to occur when the first and second semiconductor devices 150 and 160 are connected together via the stacking projection electrodes 174. This enables the implementation of a reliable semiconductor device offering a high yield.

A significant reduction in the thicknesses of the first and second wiring boards 100 and 130 makes it possible to sharply reduce the thickness stacked configuration as a whole. If the first semiconductor device 150 and the second semiconductor device 160 are separately produced and then stacked on each other, the semiconductor devices can be individually subjected to electrical tests and the like. This makes it possible to produce a stacked semiconductor device offering a high yield.

With the resin wiring board according to the present invention, varying the characteristics of the resin films formed on the front and back surfaces of the resin base material makes it possible to absorb an amount of warpage resulting from the difference in thermal expansion coefficient between constituent members. This enables the implementation of a wiring board and a semiconductor device which are thin and which may as a whole be warped only by a small amount. The wiring board and the semiconductor device are useful particularly in the field of portable electronic equipment.

What is claimed is:

1. A wiring board comprising a planar resin base material, element connection terminals arranged in a semiconductor element mounting area formed on a first surface of the resin base material and in an area around a periphery of the semiconductor element mounting area, external connection terminals arranged on a second surface of the resin base material and electrically connected to the element connection terminals, a first resin film shaped to cover the first surface of the resin base material, while exposing the element connection terminals and the semiconductor element mounting area, and a second resin film shaped to cover the second surface of the resin base material, while exposing the external connection terminals, wherein the first resin film and the second resin film are different in at least one of a glass transition point, cure shrinkage, and a thermal expansion coefficient.

2. The wiring board according to claim 1, wherein the external connection terminals are arranged in an array on the second surface of the resin base material.

3. The wiring board according to claim 1, wherein the first resin film has a higher glass transition point than the second resin film.

4. The wiring board according to claim 1, wherein the first resin film has a greater cure shrinkage than the second resin film.

5. The wiring board according to claim 1, wherein the first resin film has a greater thermal expansion coefficient than the second resin film.

6. The wiring board according to claim 1, wherein a filler contained in the first resin film and a filler contained in the second resin film are made of inorganic particles, and the amount of the filler contained in the first resin film is smaller than that of the filler contained in the second resin film.

7. The wiring board according to claim 6, wherein the fillers in the first and second resin films are made of inorganic particles of different materials.

8. The wiring board according to claim 6, wherein resin components in the first and second resin films are one of an epoxy resin and a polyimide resin.

9. The wiring board according to claim 1, wherein the resin base material is made of one type of resin selected from a glass epoxy resin, an epoxy resin, a bismaleimide-triazine resin (BT resin), an acrylic butadiene styrene resin (ABS resin), a polyimide resin, a polyamide resin, and an acrylic resin.

10. A semiconductor device comprising the wiring board according to claim 1 and a semiconductor element mounted in the semiconductor element mounting area of the wiring board.

11. A semiconductor device comprising a first wiring board and a second wiring board each of which is made of the wiring board according to claim 1, the first wiring board having stacking connection terminals provided in an area around an outer periphery of the semiconductor element mounting area on a first surface of the wiring board and connected to the second wiring board, the stacking connection terminals being exposed from the first resin film, the second wiring board having the external connection terminals provided at positions corresponding to the stacking connection terminals on the first wiring board, the first and second wiring boards having a semiconductor element mounted in the respective semiconductor element mounting areas, the stacking connection terminals on the first wiring board being connected to the external connection terminals on the second wiring board via stacking projection electrodes.

12. The semiconductor device according to claim 11, wherein the external connection terminals on the first wiring board are arranged in an array on the second surface of the resin base material.

* * * * *